US007701555B2

(12) United States Patent
Arai (10) Patent No.: US 7,701,555 B2
(45) Date of Patent: Apr. 20, 2010

(54) EXPOSURE APPARATUS, EXPOSURE METHOD, DEVICE MANUFACTURING METHOD, AND SYSTEM

(75) Inventor: Masayoshi Arai, Kumagaya (JP)

(73) Assignee: Nikon Corporation, Tokyo (JP)

( * ) Notice: Subject to any disclaimer, the term of this patent is extended or adjusted under 35 U.S.C. 154(b) by 376 days.

(21) Appl. No.: 11/662,591

(22) PCT Filed: Jun. 30, 2006

(86) PCT No.: PCT/JP2006/013104

§ 371 (c)(1),
(2), (4) Date: Mar. 13, 2007

(87) PCT Pub. No.: WO2007/004567

PCT Pub. Date: Jan. 11, 2007

(65) Prior Publication Data

US 2007/0273852 A1    Nov. 29, 2007

Related U.S. Application Data

(60) Provisional application No. 60/781,735, filed on Mar. 14, 2006.

(30) Foreign Application Priority Data

Jul. 1, 2005    (JP)    ............................. 2005-194373

(51) Int. Cl.
*G03B 27/42*    (2006.01)
*G03B 27/52*    (2006.01)

(52) U.S. Cl. .............................. 355/67; 355/44; 355/53; 355/55; 355/69; 355/77; 430/30

(58) Field of Classification Search .................... 355/53, 355/55, 67, 71, 77, 69, 44; 356/71, 213, 356/215; 372/9; 430/30
See application file for complete search history.

(56) References Cited

U.S. PATENT DOCUMENTS

| 5,656,882 A | 8/1997 | Lazarus et al. |
| 5,687,462 A | 11/1997 | Lazarus et al. |
| 5,763,930 A | 6/1998 | Partlo |
| 5,848,089 A | 12/1998 | Sarkar et al. |
| 7,073,924 B2 | 7/2006 | Koizumi et al. |

(Continued)

FOREIGN PATENT DOCUMENTS

JP    2004-537176    12/2004

(Continued)

*Primary Examiner*—Hung Henry Nguyen
*Assistant Examiner*—Colin Kreutzer
(74) *Attorney, Agent, or Firm*—Oliff & Berridge, PLC (57) ABSTRACT

An exposure apparatus is equipped with a laser unit that emits a laser beam, a memory that stores a first information which shows a first relation indicating a relation between a linewidth error of a pattern formed on a wafer and a spectral characteristic of the laser beam emitted from the laser unit, and a main controller that controls the spectral width of the laser beam via a laser controller, based on the first information and on information related to a reticle that is to be used. Main controller performs spectral width control of the laser beam so as to suppress linewidth error, based on the first information and on the information related to the reticle that is to be used.

23 Claims, 5 Drawing Sheets

U.S. PATENT DOCUMENTS

| | | | |
|---|---|---|---|
| 7,256,870 B2 * | 8/2007 | Finders | 355/67 |
| 2001/0026448 A1 * | 10/2001 | Koizumi et al. | 362/268 |
| 2003/0147059 A1 | 8/2003 | Tokuda et al. | |
| 2006/0139607 A1 | 6/2006 | Bruls et al. | |
| 2006/0139610 A1 | 6/2006 | Bruls et al. | |
| 2006/0170899 A1 | 8/2006 | De Kruif et al. | |

FOREIGN PATENT DOCUMENTS

| | | |
|---|---|---|
| JP | 2006-179937 | 7/2006 |
| WO | WO 03/011595 A2 | 2/2003 |

* cited by examiner

— EXPOSURE APPARATUS, EXPOSURE METHOD, DEVICE MANUFACTURING METHOD, AND SYSTEM

TECHNICAL FIELD

The present invention relates to exposure apparatus, exposure methods, device manufacturing methods, and systems, and more particularly to an exposure apparatus that is equipped with a laser unit as an exposure light source, an exposure method performed with the exposure apparatus, a device manufacturing method using the exposure method, and a system that includes a plurality of laser units.

BACKGROUND ART

In recent years, in a sequentially moving type exposure apparatus such as a stepper or a scanning stepper (also called a scanner), a spectrum narrowed pulse oscillation excimer laser of a discharged pumped type is used as the light source. The pulse beam oscillated from the excimer laser passes the illumination optical system of the exposure apparatus main body and is irradiated on the photosensitive agent coated on the surface of the wafer mounted on the wafer stage exposing the photosensitive agent, and the wafer is exposed.

As for the spectral width of a laser beam, narrowing is required from the point of optical system design of the exposure apparatus, especially from the point of permissible chromatic aberration. Regarding the quality level of such narrowing, conventionally, a specific upper limit value was usually set to the spectral width, and as for the laser used in the light source of an exposure apparatus, maintaining the spectral width under the above specific upper limit while including changes due to various causes was required. Narrowing to a desired spectral width is achieved by using optical elements such as a grating, an etalon (a Fabry-Perot etalon).

Further, conventionally, the level of sensitivity of the exposure apparatus image-forming performance with respect to the variation amount of the spectral width of the laser beam could be ignored.

The present situation surrounding the sequentially moving type exposure apparatus is that due to finer patterns subject to image-forming corresponding to higher integration of semiconductor devices or the like, numerical aperture of the projection optical system (projection lens) is increasing (higher N.A.), and as a consequence, narrowing of the laser spectral is progressing to the ultimate level. Further, nowadays, according to finer device rules that accompany the finer patterns subject to image-forming (subject to resolution), the sensitivity of the image-forming with respect to the spectral change has reached a level that can no longer be ignored.

Especially the influence that the spectral width change of the laser beam has on the line width of an isolated line is at a level that can no longer be ignored.

Further, in recent years, a mask correction (a reticle pattern correction) called optical proximity effect correction (OPC; Optical Proximity Correction) in which a desired pattern is obtained on a wafer by predicting the optical proximity effect (OPE) in advance and correcting the reticle pattern is actively performed. As the cause of linewidth error after the OPC, various causes that change spectral characteristics of the laser beam oscillated from the laser light source are also becoming a cause that cannot be ignored. As the cause of the change in spectral characteristics of the laser beam, manufacturing error of the narrowing element, energy state of a gain generator, emission angle characteristics and oscillation conditions (duty) of the resonator and the like can be representatively given.

Accordingly, with the laser unit used as a light source in an exposure apparatus, management and control of the spectral width of the laser beam are required more than ever, and at the same time, as for monitoring the spectral, the measurement accuracy has to be improved than before, and calibration errors of the monitoring have to be kept to a minimum.

Further, when manufacturing a semiconductor device, a plurality of exposure apparatus are used, therefore, it is desirable that errors are minimal in spectral characteristics of the laser beam oscillated from the light source among the exposure apparatus in the same manufacturing line.

DISCLOSURE OF INVENTION

Means for Solving the Problems

The present invention was made under the circumstances described above, and according to a first aspect of the present invention, there is provided an exposure apparatus that exposes an object with an energy beam and forms a pattern on the object, the apparatus comprising: a laser unit that emits a laser beam as the energy beam; a storage unit that stores a pattern size error-spectral characteristic information which shows a relation between size error of the pattern formed on the object and spectral characteristic of the laser beam emitted from the laser unit; and a spectral control unit that controls spectral width of the laser beam based on the pattern size error-spectral characteristic information and information related to the pattern that is to be used.

According to the apparatus, the spectral control unit performs a spectral width control of the laser beam so as to suppress the size error, based on the pattern size error-spectral characteristic information, which shows the relation between the size error of the pattern formed on the object and the spectral characteristic of the laser beam emitted from the laser unit, and information related to the pattern that is to be used.

According to a second aspect of the present invention, there is provided a first exposure method in which an object is exposed with a laser beam emitted from a laser light source and a pattern is formed on the object, the method comprising: a process of inputting information related to a pattern that is to be used; and a process of controlling spectral width of the laser beam, based on the information that has been input and a pattern size error-spectral characteristic information which shows a relation between size error of the pattern formed on the object and spectral characteristic of the laser beam emitted from the laser unit.

According to this method, information related to the pattern that is to be used is input, and based on the information that has been input and the pattern size error-spectral characteristic information which shows the relation between the size error of the pattern formed on the object and spectral characteristic of the laser beam emitted from the laser unit, the spectral width of the laser beam is controlled. Accordingly, spectral width control of the laser beam that suppresses the size error is performed, and since exposure is performed in this state, the pattern is formed without a size error on the object.

According to a third aspect of the present invention, there is provided a second exposure method in which an object is exposed with a laser beam emitted from a laser light source and a pattern is formed on the object, the method comprising: a process of obtaining information of a total exposure amount of the laser beam emitted from the laser light source; and a process of deciding a spectral width correction value, based on the information of the total exposure amount that has been obtained.

According to this method, information of the total exposure amount of the laser beam emitted from the laser light source is obtained, and based on the information of the total exposure amount that has been obtained, the spectral width correction value is decided. In this case, for example, the spectral width correction value can be decided so that the size error of the pattern does not occur. Accordingly, by performing exposure of the object by adjusting the spectral width of the laser beam output from the laser light source to the spectral width that has been computed, the pattern can be formed without a size error on the object.

Further, in a lithography process, by performing exposure of a sensitive object using one of the first and second exposure methods of the present invention, it becomes possible to form a device pattern on the sensitive object with good precision. Accordingly, from a fourth aspect of the present invention, it can also be said that the present invention is a device manufacturing method that uses one of the first and second exposure methods of the present invention.

According to a fifth aspect of the present invention, there is provided a system that includes a plurality of laser units, the system comprising: a spectroscope commonly used on spectral width measurement of a laser beam output from the plurality of laser units; and a reference light source used for calibration of the spectroscope.

According to the system, by performing calibration of the spectroscope using the reference light source and performing spectral width measurement of the laser beam output from the plurality of laser units, it becomes possible to measure the spectral width of the laser beam output from each laser unit with good precision. Further, in the case each laser unit has a spectral monitor, by performing simultaneous measurement of the spectral width of the laser beam by using the calibrated spectroscope and each spectral monitor, it becomes possible to calibrate each spectral monitor easily and with good accuracy.

BEST MODE FOR CARRYING OUT THE INVENTION

A First Embodiment

A first embodiment of the present invention is described below, referring to FIGS. 1 to 7.

Figure 1:
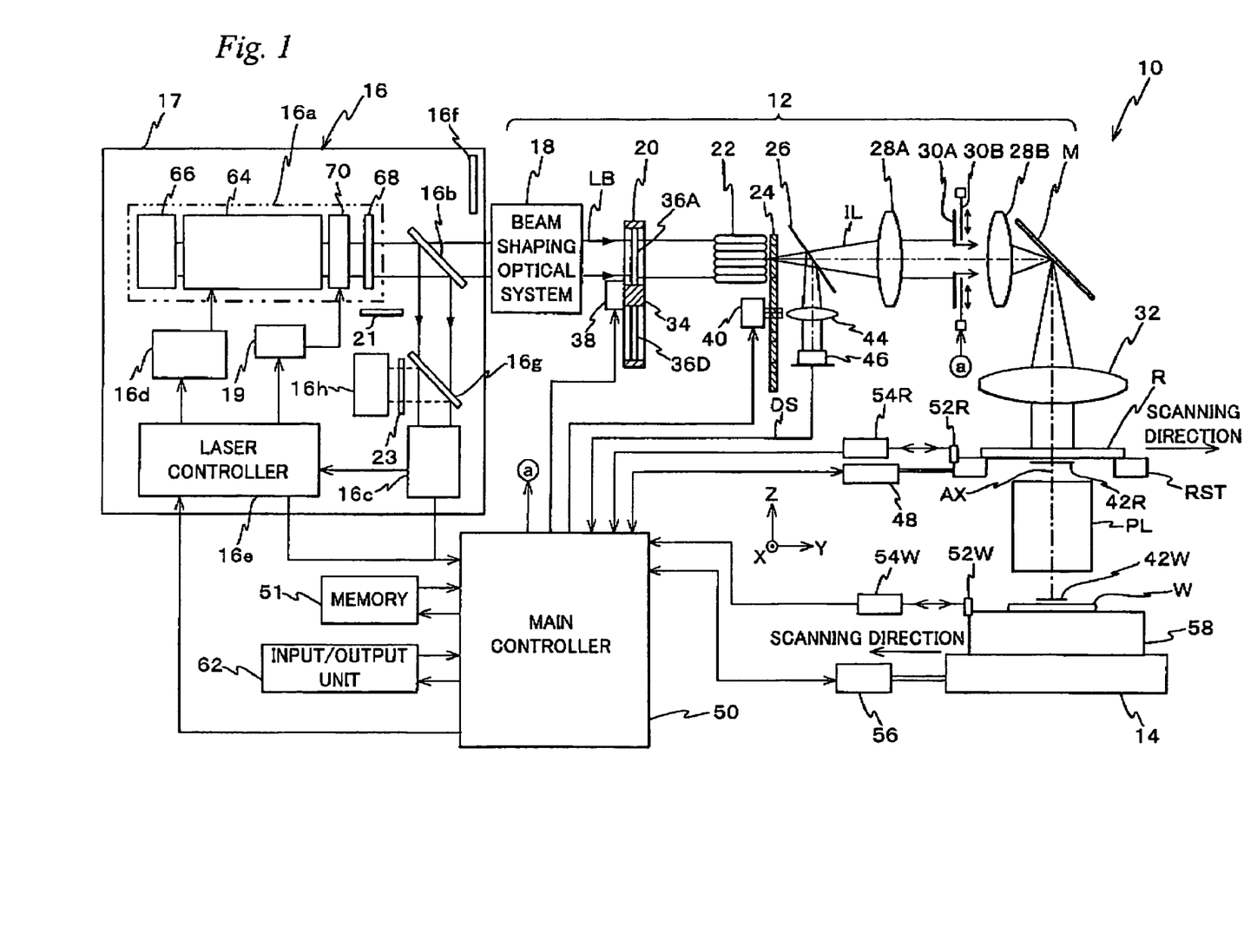
FIG. 1 is a schematic view of an arrangement of an exposure apparatus related to a first embodiment.
Figure 2:
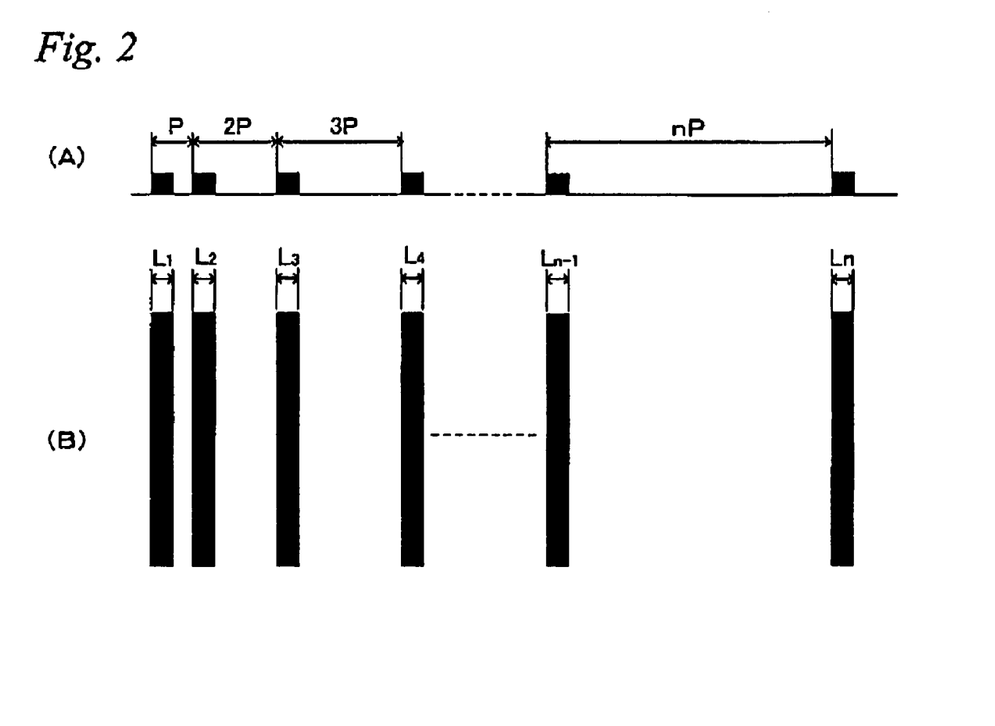
FIG. 2A is a view used for describing peak bias, and shows an example of n line patterns formed on a reticle that have the same line width but are spaced differently apart.
FIG. 2B is a view that shows resist images which are obtained as a result of transferring the patterns of FIG. 2A onto a wafer.

FIG. 1 is an entire view of an arrangement of an exposure apparatus 10 related to the first embodiment. Exposure apparatus 10 is a scanning exposure apparatus based on a step-and-scan method that uses a laser unit for an exposure light source.

Exposure apparatus 10 is equipped with an illumination system that includes a laser unit 16 and an illumination optical system 12, a reticle stage RST that moves in a predetermined scanning direction (in this case, a Y-axis direction, which is the lateral direction within the page surface of FIG. 1) holding a reticle R illuminated by the illumination system, a projection optical system PL that projects an image of a pattern of reticle R on a wafer W, an XY stage that moves within a horizontal plane (an XY plane) holding wafer W, a control system for these components and the like.

As laser unit 16, for instance, a KrF excimer laser (oscillation wavelength 248.385 nm) is to be used. As laser unit 16, instead of the KrF excimer laser, as a matter of course, it is also possible to use an ArF excimer laser (oscillation wavelength 193 nm), an $F_2$ laser (oscillation wavelength 157 nm), as well as a pulse light source such as a copper vapor laser, a YAG laser, or a harmonic wave generation unit of a semiconductor laser.

As is shown in FIG. 1, laser unit 16 is equipped with a laser resonator 16a, a beam splitter 16b arranged on an optical path of a laser beam LB emitted form laser resonator 16a that has a transmittance of around 97%, a half mirror (or a beam splitter) 16g and a beam monitor mechanism 16c arranged sequentially on a reflection optical path of beam splitter 16, a reference light source 16h, a laser controller 16e to which output signals from beam monitor mechanism 16c are input, a laser power supply section 16d whose power supply voltage is controlled by laser controller 16e, and the like. As is shown in FIG. 1, each component sections (16a to 16e, 16g, 16h and the like) of laser unit 16 are housed inside a housing 17. Laser beam LB, which is emitted from laser resonator 16a and passes through beam splitter 16b, enters illumination optical system 12 via a light transmitting section (not shown) and a light transmitting optical system of housing 17.

It is possible to dispose either laser controller 16e or laser power supply section 16d, or both laser controller 16e and laser power supply section 16d, outside housing 17.

Laser resonator 16a includes an excimer laser tube (laser chamber) 64 including a discharging electrode, a total reflection mirror (rear mirror) 66 placed on the rear side of excimer laser tube 64 (on the left side within the page surface of FIG. 1), a low reflectivity mirror (front mirror) 68 placed on the front side of excimer laser tube 64 (on the right side within the page surface of FIG. 1), a narrowbanding module 70 arranged between excimer laser tube 64 and front mirror 64 and the like.

In this case, rear mirror 66 and front mirror 205 constitute a resonator, which slightly increases the coherency.

Narrowbanding module 70, for instance, includes a fixed Fabry-Perot etalon and a tunable tilt Fabry-Perot etalon sequentially arranged on the optical path of laser beam LB between excimer laser tube 64 and front mirror 68.

Fabry-Perot etalon (hereinafter shortened to "etalon") are two silica glass plates that face each other with a predetermined gap (air-gap) in between, and functions as a kind of bandpass filter. The fixed Fabry-Perot etalon is used for rough adjustment, and the tilt tunable Fabry-Perot etalon is used for fine adjustment. These etalons output the spectral width of laser beam LB emitted from laser resonator 16a narrowing the beam to the extent of 1/100 to 1/300 of a natural oscillation spectral width. Further, by adjusting the tilt angle of the tilt tunable Fabry-Perot etalon, the wavelength (central wavelength) of laser beam LB emitted from laser resonator 16a can be shifted within a predetermined range.

Besides the arrangement described above, the laser resonator can be configured, for example, by removing the above etalon for rough adjustment, and arranging a tilt tunable reflection diffraction grating (grating), which is a type of a wavelength selection element, instead of rear mirror 66. In this case, the grating and front mirror 68 constitute the resonator. Further, the grating and the etalon for fine adjustment constitute a narrowbanding module that has a similar function as the one previously described. In this case, the grating is used for rough adjustment when setting the wavelength, whereas the etalon is used for fine adjustment. By changing the tilt angle of either the etalon or the grating, the wavelength (oscillation wavelength) of laser beam LB emitted from the laser resonator can be changed within a predetermined range.

It is also possible to configure the narrowbanding module, for example, by combining a prism and a diffraction grating (grating).

Inside excimer laser tube 64, laser gas (consisting of krypton Kr and fluorine $F_2$ serving as medium gas and helium He serving as buffer gas) of a predetermined concentration ratio is filled. To excimer laser tube 64, for example, an exhaust pipe made up of a flexible tube is connected via an exhaust valve (not shown). In the exhaust pipe, a detoxifying filter that traps fluorine, and an exhaust pump and the like are arranged. This arrangement is due to taking into consideration the toxicity of fluorine, and the exhaust pump discharges the gas outside the unit after the detoxifying filter detoxifies the exhaust gas.

Further, one end of a flexible gas supply pipe is connected to excimer laser tube 64 via an intake valve (not shown), and the other end of the gas supply pipe is connect to a gas container (omitted in drawings) that contains Ar, $F_2$, He or the like.

The open/close operation of each of the above valves is controlled by a main controller 50. For example, at the time of gas exchange or the like, main controller 50 performs adjustment so that the laser gas within excimer laser tube 64 is adjusted to a predetermined concentration ratio and pressure. Further, inside excimer laser tube 64, at the time during laser oscillation, the laser gas is constantly circulated with a fan (not shown).

Incidentally, since excimer laser tube 64 is a discharge section, the temperature becomes extremely high. Therefore, in the embodiment, excimer laser tube 64 is thermally isolated sufficiently from its periphery, and temperature control is performed to a constant temperature by a cooling medium such as water. More specifically, in the periphery of excimer laser tube 64, a coolant piping (not shown) is disposed, and the coolant piping is also connected to the outside via the flexible tube (not shown). Water or other cooling medium is supplied and circulated in the coolant piping from an external cooling unit, and the temperature of the medium is controlled by the control system of the cooling unit.

Half mirror 16g is positioned on an optical path of light from reference light source 16h. Furthermore, on an optical path between beam splitter 16b and half mirror 16g, a first shutter 21 that moves in a lateral direction of the page surface of FIG. 1 (the Y-axis direction) and opens/closes the optical path is arranged, and also on an optical path between reference light source 16h and half mirror 16g, a second shutter 23 that moves in a direction orthogonal to the page surface of FIG. 1 (the X-axis direction) and opens/closes the optical path is arranged.

Accordingly, laser beam LB that has been reflected off beam splitter 16b and the light from reference light source 16h can enter beam monitor mechanism 16c. In this case, main controller 50 controls the open/close operation of the first shutter 21 and the second shutter 23 via a shutter drive mechanism (not shown) so that laser beam LB and the light from reference light source 16h alternatively enters beam monitor mechanism 16c, via half mirror 16g. Main controller 50 normally keeps the first shutter 21 in an open state and the second shutter 23 in a closed state as is shown in FIG. 1, however, at the time during absolute wavelength calibration of the beam monitor within beam monitor mechanism 16c which will be described later or the like, the first shutter 21 will be in a closed state and the second shutter 23 will be in an open state.

Although it is not shown, beam monitor mechanism 16c includes an energy monitor and a beam monitor (spectral monitor). The energy monitor is placed, for example, on a reflection optical path of a half mirror (not shown) placed on a transmission optical path of half mirror 16. As the energy monitor, for example, a photodetection element such as a PIN type photo diode that has a high response frequency for detection pulse light in the far ultraviolet region is used. The photodetection conversion signals (light quantity signals) from the energy monitor are output to laser controller 16e.

As the beam monitor, for example, a Fabry-Perot interferometer including a condenser lens, a collimator lens, an etalon, a telemeter lens, a line sensor and the like sequentially placed on the transmission optical path of half mirror 16g is used. In this case, as the etalon, two pieces of partial reflection mirrors (silica glass plates or the like) that are place facing each other with a predetermined gap (air gap) in between are used. When laser beam LB enters this etalon, the diffracted light at partial reflecting surfaces (a secondary wave by Huygens' principle) reflects reflection and transmission in the air gap. At this point, only a beam in the direction of an incident angle θ that satisfies equation (1) below passes through the etalon and is intensified. Accordingly, a fringe pattern is formed on the focal plane of the telemeter lens, and the fringe pattern is detected with the line sensor placed on the focal plane of the telemeter lens.

$$2*n*d*\cos\theta = m\lambda \tag{1}$$

In the above equation, d represents the air gap, n represents the refractive index of the air gap, and m represents an order.

From the above equation (1), it can be seen that if n, d and m are constant, the fringe pattern formed on the focal plane varies depending on the difference of wavelength λ.

In the distribution of light intensity detected with the line sensor placed on the focal plane of the telemeter lens, a mountain shape corresponding to the interference fringe appears at a predetermined interval in the longitudinal direction of the line sensor on the focal plane of the telemeter lens. The width of the section equivalent to ½ of the mountain height of each light intensity distribution corresponds to the spectrum line full width (Full Width at Half Maximum (FWHM)). Further, the position of the line sensor in the longitudinal direction corresponding to the peak of the mountain of each light intensity distribution is decided according to the central wavelength. More specifically, the fringe pattern previously described corresponds to the central wavelength and the spectral line width (FWHM) of the incident light, and the imaging signals of the fringe pattern is output to laser controller 16e from the beam monitor inside beam monitor mechanism 16c.

Laser power supply section 16d includes a high voltage power supply, a pulse compression circuit (switching circuit) that makes the discharging electrode (not shown) within excimer laser tube 64 discharge at a predetermined timing using the high voltage power supply, and the like.

Laser controller 16e includes an image processing circuit (including an AD converter, a peak holding circuit, or the like) that applies a predetermined signal processing to the imaging signals of the fringe pattern and the output signals of the energy monitor previously described, a microcomputer that performs a predetermined computation, and the like. By applying the predetermined signal processing to the imaging signals of the fringe pattern, laser controller 16e obtains information related to the optical characteristics of incident light (laser beam) LB with respect to beam monitor mechanism 16c, such as for example, information on central wavelength (or centroidal wavelength) $\lambda$ and spectral line width (FWHM).

Laser controller 16e uses central wavelength $\lambda$ of laser beam LB, and computes a shift amount (wavelength shift amount) $\Delta\lambda$ of central wavelength $\lambda$ to a set wavelength $\lambda_0$ set by main controller 50, according to equation (2) below.

$$\Delta\lambda = |\lambda_0 - \lambda| \quad (2)$$

Further, laser controller 16e computes the variation amount of the spectral line width based on the difference between the above spectrum line with and a reference value of the spectral line width, such as, for example, an initial spectral line width.

Furthermore, in the embodiment, in laser unit 16, a drive mechanism 19 of dispersion elements such as the tilt tunable etalon (or the grating and the tilt tunable etalon, or the grating or the prism) that constitutes laser resonator 16a is arranged. Then, drive mechanism 19 is controlled by laser controller 16e based on wavelength shift amount $\Delta\lambda$ previously described, and central wavelength $\lambda$ is controlled within a desired range.

Further, at the time of regular exposure, laser controller 16e performs feedback control of the power supply voltage in the high voltage power supply inside laser power supply section 16d based on the energy power detected according to the output of the energy monitor, so that the energy per pulse of laser beam LB emitted from laser resonator 16a becomes a value corresponding to a target value of the energy per pulse given by control information from main controller 50.

Further, laser controller 16e also controls the number of pulses or repetition frequency (oscillation frequency) of the pulse oscillation during exposure of one shot area on wafer W, by controlling the applied timing or applied interval of trigger signals to the pulse compression circuit within laser power supply section 16d.

Reference light source 16h is the reference light source when performing an absolute wavelength calibration of the beam monitor inside beam monitor mechanism 16c, and a fixed narrowband laser is used. In the embodiment, as reference light source 16h, an Ar ion second harmonic laser light source (Argon ion second harmonic laser light source) is used. The central wavelength of the Ar ion second harmonic laser light source is 248.253, which is fairly close to the central wavelength $\lambda_0$=248.385 nm of the KrF excimer laser unit, and is suitable for reference. Moreover, since the spectral half-width is extremely narrow and does not exceed 0.01 pm, the deconvolution process, which will be described later, can be performed with good precision, thus, the Ar ion second harmonic laser light source is used.

Besides the above description, on the illumination optical system side of beam splitter 16 within housing 17 of laser unit 16, a shutter 16f is also placed so as to block laser beam LB according to the control information from main controller 50.

Illumination optical system 12 is equipped with a beam shaping optical system 18, a rough energy adjuster 20, an optical integrator (a fly-eye lens, an internal reflection type integrator, a diffraction optical element or the like, and since a fly-eye lens is used in FIG. 1, it will also be referred to as a "fly-eye lens" in the description below) 22, an illumination system aperture stop plate 24, a beam splitter 26, a first relay lens 28A, a second relay lens 28B, a fixed reticle blind 30A, a movable reticle blind 30B, an optical path bending mirror M, a condenser lens 32 and the like.

Rough energy adjuster 20 is placed on the optical path of laser beam LB behind beam shaping optical system 18 that shapes the sectional shape of laser beam LB, which is the pulsed light emitted from excimer laser 16. Rough energy adjuster 20 includes a rotating plate 34 on which a plurality of (e.g. six) ND filters (in the embodiment, the ND filter is a light attenuating filter, and in FIG. 1, two of the ND filters 36A and 36D are shown) that have a different transmittance (=1−attenuation ratio) are placed along a circumferential direction, and a drive motor 38 rotates rotating plate 34 so as to make the transmittance to the incident laser beam LB switchable in a plurality of steps from 100% in a geometric progression. Drive motor 38 operates under the control of main controller 50. Rough energy adjuster 20 can also make the transmittance to the incident laser beam LB variable continuously instead of in a plurality of steps.

Illumination system aperture stop plate 24 made of a disk-shaped member is placed on the optical path of laser beam LB behind rough energy adjuster 20 with fly-eye lens 22 in between. On illumination system aperture stop plate 24, for example, an aperture stop made up of a regular circular aperture, an aperture stop made up of a small circular aperture to minimize a $\sigma$ value, which is a coherence factor, an annular aperture stop for a ring-shaped illumination, and a modified aperture stop for a modified light source method made up of a plurality of apertures placed in an eccentric arrangement, are arranged at a substantially equal angle (only two types of aperture stops are shown in FIG. 1). Illumination system aperture stop plate 24 is placed in the vicinity of the outgoing surface of fly-eye lens 22, that is, in the embodiment, on the focal plane on the outgoing side of fly-eye lens 22 that substantially coincides with the pupil plane of the illumination optical system.

Illumination system aperture stop plate 24 is rotated by a drive unit 40 such as a motor controlled by main controller 50, and an aperture stop is selectively set on the optical path of illumination light IL. Accordingly, fly-eye lens 22 changes the size and/or the shape of a plane light source consisting of a large number of point light sources on the pupil plane of illumination optical system 12, that is, the secondary light source. In the embodiment, the intensity distribution of illumination light IL on the pupil plane of illumination optical system 12, or in other words, the illumination condition, was changed using illumination system aperture stop plate 24, however, optical elements (optical system) for changing the illumination condition is not limited to this. The illumination condition can be changed using an optical system that has a switchable optical element (such as a diffraction optical element) and a movable optical element (such as a zoom lens and/or a prism) as is disclosed in, for example, U.S. Pat. No. 6,563,567 and U.S. Pat. No. 6,710,855. As long as the national laws in designated states (or elected states), on which this international application is applied, permit, the above disclosures are fully incorporated herein by reference.

On the optical path of laser beam LB emitted from illumination system aperture stop plate 24, or more specifically, on the optical path of illumination light IL, beam splitter 26 is placed that has a small reflectivity and a large transmittance, and further downstream of the optical path, the first relay lens 28A and the second relay lens 28B are placed with fixed reticle blind 30A and movable reticle blind 30B arranged in between.

Fixed reticle blind 30A is placed on a plane slightly defocused from a conjugate plane with respect to the pattern surface of retile R, and a rectangular aperture that sets an illumination area 42R on reticle R is formed. Further, in the vicinity of fixed reticle blind 30A, movable reticle blind 30B that has a variable aperture section is placed, and by further limiting illumination area 42R via movable reticle blind 30B at the beginning and the end of scanning exposure, unnecessary exposure can be prevented.

On the optical path of illumination light IL behind the second relay lens 28B, bending mirror M that reflects illumination light IL having passed through the second relay lens 28B toward reticle R is placed, and on the optical path of illumination light IL behind bending mirror M, condenser lens 32 is placed.

Meanwhile, illumination light IL reflected by beam splitter 26 is received by an integrator sensor 46 via a condenser lens 44, and photoelectric conversion signals of integrator sensor 46 are supplied to main controller 50 as an output DS (digit/pulse) via a holding circuit and an A/D converter (not shown). As integrator sensor 46, for example, a PIN type photo diode or the like that has sensitivity within the far ultraviolet region and a high response frequency for detecting the pulse light emitted from laser unit 16 can be used.

Reticle R is mounted on reticle stage RST, and is held by suction via a vacuum chuck (not shown) or the like. Retile stage RST is finely movable within a horizontal plane (the XY plane), as well as is scanned in the scanning direction (the Y-axis direction) by a reticle stage drive system 48 in a predetermined stroke range. The position of reticle stage RST measured with a laser interferometer 54R, which irradiates a measurement beam on a movable mirror 52R fixed on reticle stage RST, and the measurement values of laser interferometer 54R are supplied to main controller 50.

As projection optical system PL, for example, a refractive system is used that is a both-side telecentric reduction system and includes a plurality of lens elements that has a common optical axis Ax in the Z-axis direction. Further, projection magnification δ of projection optical system PL is, for example, one-quarter or one-fifth. Therefore, when illumination light IL illuminates illumination area 42R on reticle R in the manner previously described, an image (a partial image) of the pattern formed on reticle R reduced by projection magnification δ by projection optical system PL is formed on a slit shaped exposure area (an area conjugate to illumination area 42A) 42W on wafer W, on which a resist (a photosensitive agent) has been coated.

XY stage 14 is moved two-dimensionally within the XY plane in the Y-axis direction, which is the scanning direction and the X-axis direction (the direction orthogonal to the page surface in FIG. 1) orthogonal to the Y-axis direction by a wafer stage drive system 56. On XY stage 14, a Z-tilt stage 58 is mounted, and on Z-tilt stage 58, wafer W is held by a vacuum suction system or the like via a wafer holder (not shown). Z-tilt stage 58 adjusts the position of wafer W in the Z-axis direction (focus position), and also has the function of adjusting the tilt angle of wafer W with respect to the XY plane. Further, the position of XY stage 14 is measured with a laser interferometer 54W, which irradiates a measurement beam on a movable mirror 52W fixed on Z-tilt stage 58, and the measurement values of laser interferometer 54W are supplied to main controller 50.

Furthermore, although it is omitted in the drawings, above reticle R, a pair of reticle alignment systems is arranged of an image processing method that uses light of the exposure wavelength (illumination light IL in the embodiment) as the illumination light for alignment, as is disclosed in, for example, Kokai (Japanese Patent Unexamined Application Publication) No. 7-176468, the corresponding U.S. Pat. No. 5,646,413 and the like. In this case, the pair of reticle alignment systems is installed arranged symmetrically with respect to a YZ plane that includes optical axis AX of projection optical system PL. As long as the national laws in designated states (or elected states), on which this international application is applied, permit, the above disclosures of the publication and the U.S. Patent are fully incorporated herein by reference.

The control system includes main controller 50 in FIG. 1, and is configured including a so-called microcomputer (or a mini computer) made up of a CPU (Central Processing Unit), ROM (Read Only Memory), RAM (Random Access Memory), and the like. Main controller 50 controls, for example, the synchronous scanning of reticle R and wafer W, the stepping operation of wafer W, the exposure timing and the like in total so that the exposure operation is accurately performed.

To be more specific, for example, at the time of scanning exposure, main controller 50 controls both the position and speed of reticle stage RST and XY stage 14 via both reticle stage drive system 48 and wafer stage drive system 56 based on the measurement values of laser interferometers 54R and 54W, so that in sync with reticle R scanned in the +Y direction (or the −Y direction) via reticle stage RST at a velocity $V_R$, wafer W is scanned in the −Y direction (or the +Y direction) with respect to exposure area 42W via XY stage 14 at a velocity $\delta*V_R$ (δ is the projection magnification from reticle R to wafer W). Further, at the time of stepping operation, main controller 50 controls the position of XY stage 14 via wafer stage drive system 56 based on the measurement values of laser interferometer 54W.

Further, by supplying control information to laser unit 16, main controller 50 controls the emission timing, emission power and the like of laser unit 16, as is previously described. Further, main controller 50 controls rough energy adjuster 20 and illumination system aperture stop plate 24 via motor 38 and drive unit 40, respectively, and furthermore, controls the open/close operation of movable reticle blind 30B synchronously with the operation information of a stage system.

As is shown in FIG. 1, a memory 51 and an input/output unit 62 are also arranged with main controller 50. In memory 51, information is stored on the correlation coefficient (or the correlation function) between output DS of integrator sensor 46 and the illuminance (intensity) of illumination light IL on the surface of wafer W, the correlation coefficient (or the correlation function) between the output of the energy monitor and output DS of integrator sensor 46 and the like, and on various information used to control the spectral width (details will be described later in the description).

The absolute wavelength calibration of the beam monitor within beam monitor mechanism 16c performed by main controller 50 will be briefly described next. On performing the absolute wavelength calibration, main controller 50 opens the first shutter 21 and closes the second shutter 23, and in this state obtains information on the fringe pattern corresponding to laser beam LB from the beam monitor, and stores the information in memory 51.

Next, main controller 50 closes the first shutter 21 to cut off laser beam LB incident on the beam monitor mechanism 16c, and at the same time opens the second shutter 23 so that the light emitted from reference light source 16h is incident on beam monitor mechanism 16c. And, by comparing the fringe pattern obtained from the beam monitor with the fringe pattern stored in the image memory (the fringe pattern of laser beam LB which was incident on the beam monitor just before the first shutter 21 was closed), the deviation between the wavelength of laser beam LB and the reference wavelength can be obtained. Narrowbanding module 70 is then adjusted to correct the deviation obtained, and thus the absolute wavelength calibration of laser beam LB is performed.

On comparing the fringe pattern described above, the deconvolution process is required. The convolution (the thickness of the fringe pattern of the measured spectrum with respect to the fringe pattern corresponding to the actual spectrum) subject to the deconvolution is characteristic to each exposure apparatus, and is the amount called the apparatus function. In the embodiment, Ar ion second harmonic laser is used as the reference light source, and since the spectral width (FWHM) of the Ar ion second harmonic laser is extremely narrow and does not exceed 0.01, it can be regarded as a light having an infinitely narrow bandwidth and the deconvolution process can be performed with the actual waveform of the Ar ion second harmonic laser serving as the apparatus function.

Next, the deconvolution process (a spectrum calculation process by the obtained apparatus function) will be described. In the description below, the apparatus function will be represented as $m_i(\lambda)$. Obtaining $m_i(\lambda)$ on a regular basis leads to calibration of the beam monitor.

When the measured spectrum is represented as $s(\lambda)$, the measured spectrum can be considered as a convolution between the actual spectrum $f(\lambda)$ and apparatus function $m_i(\lambda)$, therefore, equation (3) below is valid.

$$s(\lambda)=f(\lambda)*m_i(\lambda) \quad (3)$$

In this case, a standard deconvolution will refer to a calculation procedure of dividing the "Fourier transform of the measurement data" by the "Fourier transform of the apparatus function," and then performing an inverse Fourier transform.

Accordingly, the actual spectrum $f(\lambda)$ can be obtained by performing the calculation in equation (4a) below, and then performing an inverse Fourier transform on the calculation results as is shown in equation (4b) below.

$$F(\omega)=S(\omega)/M(\omega) \quad (4a)$$

$$F^{-1}[F(\omega)]=f(\lambda) \quad (4b)$$

As is described above, in the embodiment, main controller 50 can perform deconvolution so as to obtain actual spectrum signals, and based on the actual spectrum signals, accurate information on the spectral width (e.g. FWHM, or spectral purity width E95) can be obtained. Further, main controller 50 can accurately perform the absolute wavelength calibration process of laser beam LB based on the deconvolution results, that is, main controller 50 can adjust laser beam LB almost exactly to the designed wavelength.

A management and control method of the spectrum of laser beam LB emitted from laser unit 16 will be described next.

First of all, a management and control method of the spectrum of laser beam LB using peak BIAS will be described.

Peak BIAS will now be described The case is considered when resist images with line widths $L_1, L_2, \ldots L_n$ are obtained as is shown in FIG. 2B by performing exposure of a reticle mounted on reticle stage RST on which n line patterns of the same line width spaced differently apart (P, 2P, . . . ) are formed as is shown in FIG. 2A, under a predetermined exposure condition.

In the actual exposure, line widths $L_1, L_2, \ldots L_{n-1}, L_n$ are different according to the optical proximity effect. For example, in the case of a combination of a positive type resist and a residual pattern, the line widths are $L_1 > L_2 > L_3 > \ldots$, $L_{n-1} > L_n$ by the optical proximity effect. When the design line width is L, $\Delta L_i = |L_i - L|$ (i=1, 2, . . . n) is the BIAS (bias) for each line pattern. That is, bias is an error of the line width of the actual resist image to the design line width on wafer W, and the correction amount of the pattern line width in OPC is decided according to the bias.

Further, of line widths $L_1$ to $L_n$, when the maximum line width is $L_{max}$ and the minimum line width is $L_{min}$, then $L_{max} - L_{min}$ is the peak bias (Peak BIAS).

Figure 3:
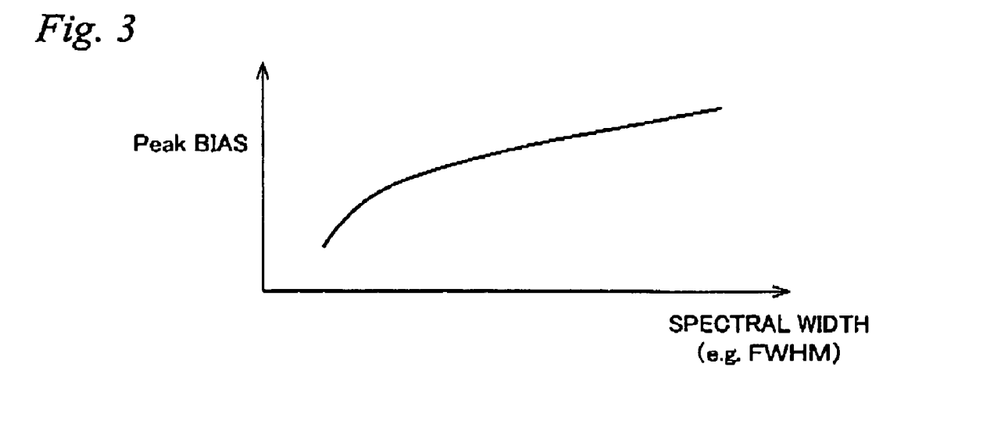
FIG. 3 is a view that shows an example of a function curve that shows a relation between spectral width (e.g. FWHM) and peak bias.

The peak bias changes according to the spectral width of the laser beam used for exposure. Therefore, in the embodiment, data of a function curve that denotes a relation between the spectral width (e.g. FWHM) and the peak bias is obtained by simulation as is shown in FIG. 3 under various exposure conditions (illumination condition, numerical aperture of the projection optical system), and the data of the function curves that have been obtained is stored in memory 51. As the index for the spectral width, for example, spectral purity width E95 can be used instead of FWHM.

Then, when an operator inputs peak bias (Peak BIAS) information related to the reticle (mask) which is to be used via input/output unit 62, main controller 50 obtains the spectral width of the laser beam suitable for the reticle that is used, and sends the information to laser controller 16e as a spectral width setting desired value.

The way of obtaining the spectral width of the laser beam suitable for the reticle that is used (the pattern subject to exposure), that is, the way of obtaining the spectral width setting desired value will be further described below.

Figure 4:
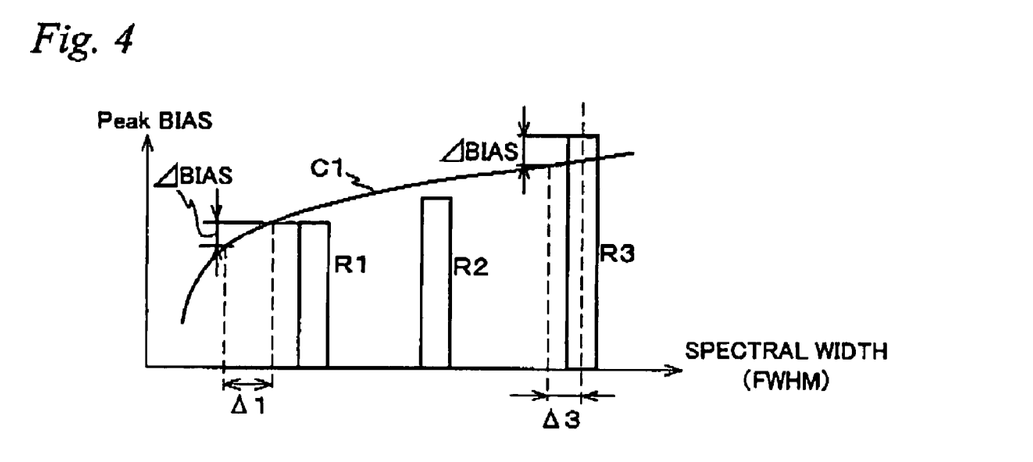
FIG. 4 is a view that shows a function curve C1, which shows a relation between spectral width (e.g. FWHM) and peak bias under an exposure condition, and peak bias information related to reticles R1 to R3.

FIG. 4 shows a function curve C1 that denotes a relation between a spectral width (e.g. FWHM), which is related to an exposure condition, stored in memory 51 and the peak bias. Further, in FIG. 4, peak bias information regarding reticle R1, reticle R2, and reticle R3 are shown in bars along with reference codes R1, R2, and R3. The position of each bar in the horizontal axis corresponds to the spectral width value when the line width reaches an allowable limit, based on the relation between the spectral width and the linewidth error obtained by simulation in advance for each reticle.

For example, in the case of reticle R3, as is shown in FIG. 4, a range Δ3 whose maximum value is the spectral width given by the input peak bias information and the minimum value is the spectral width that corresponds to the lower limit of a ΔBIAS range from the peak bias corresponding to the maximum value is obtained as the spectral width (the spectral width setting desired value) of the laser beam suitable for reticle R3.

Further, in the case of reticle R1, since the peak bias value given by the input peak bias information does not reach curve C1 as is shown in FIG. 4, the spectral width given by the input peak bias information cannot be set. Therefore, in this case, a range Δ1 whose maximum value is a point on curve C1 that corresponds to the peak bias value given by the input peak bias information and the minimum value is the spectral width that corresponds to the lower limit of the ΔBIAS range from the peak bias corresponding to the maximum value is obtained as the spectral width (the spectral width setting desired value) of the laser beam suitable for reticle R1.

The spectral width (the spectral width setting desired value) of the laser beam suitable for the remaining reticle R2 and for other reticles is also obtained in a similar manner as in the case with reticle R3 or reticle R1 described above, based on the input peak bias information.

Figure 5:
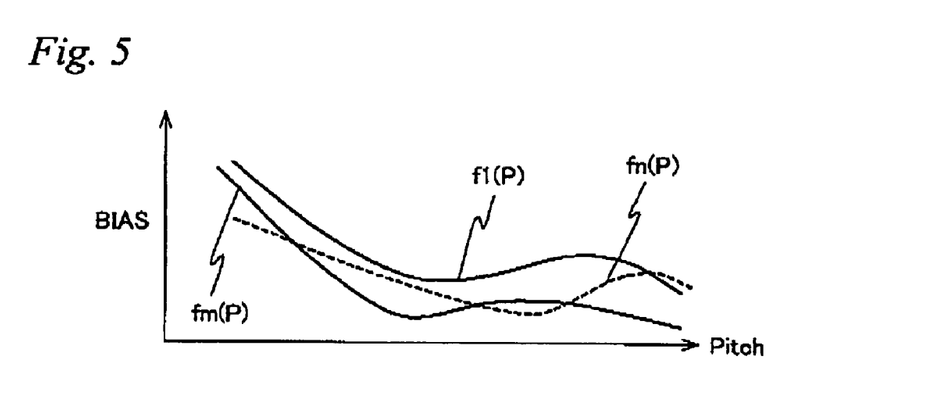
FIG. 5 is a view that shows a mask bias function $f_m(P)$ and a spectrum-BIAS function $fj(P)(j=1, 2, \ldots n)$.

In the case of focusing on a specific density state of a pattern on the reticle other than the case of using the relation between the spectral width (e.g. FWHM) and the peak bias described above, spectral selection (that is, the spectral width selection) can be performed according to the correlation coefficient between a mask bias function $f_m(P)$ and a spectrum-BIAS function $f_j(P)$ (j=1, 2, . . . , n) related to a plurality of spectra, which are expressed on a two dimensional coordinate system in which the horizontal axis shows the pitch (pattern interval) and the vertical axis shows the bias (BIAS), as is shown in FIG. 5.

More specifically, the correlation coefficient $\phi(P)$ in the following equation is computed for each of the spectrum-BIAS function $f_j(P)$, and based on the spectral that corresponds to the spectrum-BIAS function in which the degree of correlation becomes maximum, the spectral width (the spectral width of the laser beam (the spectral width setting desired value)) suitable for the retile used can be decided.

[equation 1]

$$\phi(p) = \frac{\int fm(P) \cdot fj(P) dp}{\sqrt{\int (fm(P))^2 dp} \cdot \sqrt{\int (fj(P))^2 dp}} \quad (5)$$

In any case, laser controller 16e optimizes the spectral width by adjusting the concentration ratio and the pressure of the laser gas inside excimer laser tube 64, narrowbanding module 70, the discharge timing of the discharging electrode (not shown) within excimer laser tube 64 by pulse compression circuit (switching circuit) in laser power supply section 16d, and the like, based on the spectral width setting desired value sent from main controller 50. And by using illumination light IL whose spectral width has been optimized in the manner described above according to the pattern of reticle R (such as peak BIAS information), exposure condition (illumination condition) and the like, a pattern that has a desired line width can be formed on wafer W.

Next, a management and control method of the spectrum of laser beam LB that uses a relation between dose and spectral will be described.

Figure 6:
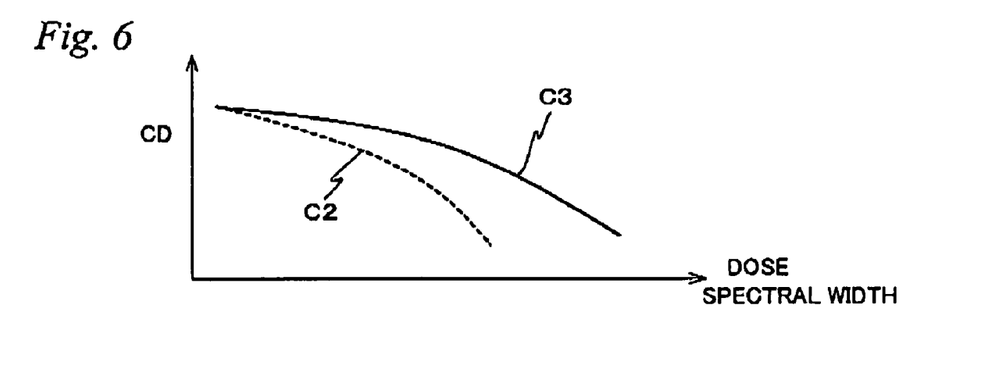
FIG. 6 is a view that shows a Dose-CD curve and a spectral width-CD curve.
Figure 7:
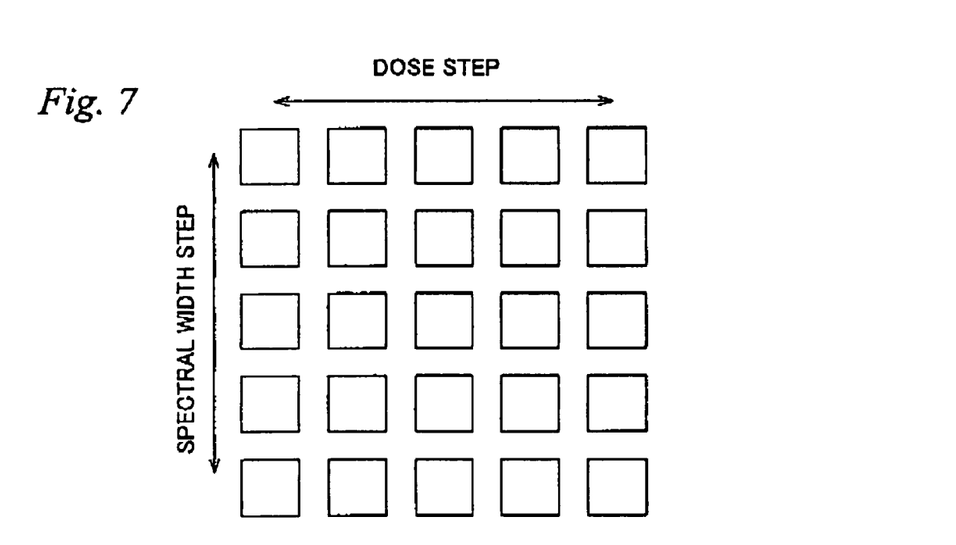
FIG. 7 is a view that shows a model of resist images formed in a matrix arrangement on a wafer.

A simulation or an experiment is to be performed in advance so that a Dose-CD curve C2 and a spectral width-CD curve C3 as is shown in FIG. 6 is obtained. In FIG. 6, the horizontal axis shows the Dose, that is, the total exposure amount (mJ/cm$_2$) on the image plane (wafer surface) of projection optical system PL or the spectral width (e.g. FWHM), and the vertical axis shows the CD (critical dimension), that is, the line width (the line width of the resist image formed on the wafer).

In the case curves C2 and C3 are obtained by experiment, the processing below should be performed.

a. A predetermined reticle used for testing is to be mounted on reticle stage RST, and in a state where the spectral width (e.g. FWHM) is set to a certain value, the pattern of the test reticle is to be sequentially transferred onto a plurality of areas in a first row of a virtual matrix on the wafer while changing the Dose little by little by a predetermined amount. The pattern transfer of the test reticle in this case is performed in a state where the wafer is set to the best focus position of projection optical system PL. Methods according to exposure, and also by aerial image measurement and the like can be given for detecting the best focus position, however, since both methods are well known, the details thereabout will be omitted.

b. Next, the spectral width (e.g. FWHM) is changed so that it is increased by a predetermined amount.

c. Then, after the spectral width has been changed, the pattern of the test reticle is to be sequentially transferred onto a plurality of areas in an adjacent row of the virtual matrix on the wafer, as in a. described above. In this case as well, the pattern transfer of the test reticle is to be performed in a state where the wafer is set to the best focus position of projection optical system PL.

d. Hereinafter, operations similar to b. and c. described above are alternately repeated.

When pattern transfer of the test reticle pattern of a planned volume in the Dose step is completed for a planned volume in the spectral width step, the wafer is developed. Accordingly, resist images are formed on the wafer in a matrix arrangement as is shown modeled in FIG. 7.

e. Next, linewidth measurement or the like of each resist image is performed using SEM or the like, and the Dose-CD curve C2 and the spectral width-CD curve C3 in FIG. 6 are made based on the measurement results.

Then, based on the Dose-CD curve C2 and the spectral width-CD curve C3 shown in FIG. 6 which are obtained in the manner describe above, a relation between the dose and the spectral width, such as for example, ΔDose/Δspectral width is obtained. This "ΔDose/Δspectral width" can be used, for example, when a change occurs in the spectral width, in the case of obtaining a correction amount of the total exposure amount (Dose) that compensates the error of the pattern linewidth caused by the change in the spectral width. Or, the "ΔDose/Δspectral width" can be used, for example, when there is a possibility of a control error of the total exposure amount (Dose) to wafer W occurring, in order to obtain the correction amount of the spectral width that compensates the error of the pattern linewidth caused by the control error of the total exposure amount.

The information that denotes the relation between the Dose and the spectral width obtained in the manner described above is stored in advance in memory 51.

And, on actual exposure, based on the information that shows the relation between the Dose and the spectral width which is already stored in memory 51 as is described above, main controller 50 changes the total exposure amount that corresponds only to the change of the spectral width equivalent to a linewidth error so that the linewidth error caused by the change of the spectral width will not occur. That is, by adjusting the exposure amount, main controller 50 prevents the change in the spectral width of laser beam LB from becoming an error cause.

For example, the spectral width of laser beam LB emitted from laser unit 16 changes due to its operation state although the change is extremely small. However, since main controller 50 can sequentially obtain the information of spectral width from beam monitor mechanism 16c or laser controller 16e, main controller 50 can calculate the exposure correction amount so that a residual linewidth error caused by the spectral width change does not occur based on the spectral line width information that has been obtained and the relation stored in memory 51 of the Dose and spectral width, and can reflect the calculation on the exposure control.

Further, contrary to the description above, when there is a possibility of a control error occurring in the exposure amount, in order to avoid a linewidth error from occurring caused by the control error, main controller 50 can change the spectral width that corresponds only to the change of the Dose equivalent to the linewidth error so as to prevent the control error of the exposure amount from becoming an error cause of the pattern linewidth.

For example, main controller 50 can obtain information of the total exposure amount (Dose quantity) of laser beam LB emitted from laser unit 16 based on the measurement values of integrator sensor 46. Accordingly, based on the information of the total exposure amount that has been obtained and the relation between the Dose and the spectral width that has been stored in memory 51, main controller 50 can obtain a spectral width correction amount and adjust the spectral width so that linewidth error caused by the control error of the total exposure amount does not occur.

As a matter of course, either one of the spectral width or the Dose can be changed so that the linewidth error of the pattern does not occur, or both the spectral width and the Dose can be changed. Accordingly, in the case a spectral width change occurs, at least one of the spectral width and the Dose can be adjusted (changed). Further, when there is a possibility of a control error occurring in the total exposure amount, at least one of the spectral width and the Dose can be adjusted (changed).

Further, instead of storing the relation between the total exposure amount and the spectral width in memory 51, the relation between the total exposure amount and the linewidth error shown in the Dose-CD curve C2 and the relation between the spectral width and the linewidth error shown in the spectral width-CD curve C3 can be stored in memory 51. In this case, at least one of the exposure amount control and spectral width control can be performed so that errors do not occur in the line width of the pattern, based on at least one of the spectral width information that has been obtained as is described above and the information of the total exposure amount that has been obtained.

Further, in order to obtain the relation between the total exposure amount and the linewidth error shown in the Dose-CD curve C2 and the relation between the spectral width and the linewidth error shown in the spectral width-CD curve C3, a reticle on which a device pattern is formed which is used when manufacturing devices can be used, instead of using the test reticle.

AS is described above, according to exposure apparatus 10 related to the embodiment, main controller 50 performs spectral width control of laser beam LB via laser controller 16e so that no size error (such as linewidth error) remains of the image of the pattern of the reticle formed on wafer W on exposure, based on a pattern size error-spectral characteristic information (for example, the function curve that shows the relation between spectral width (e.g. FWHM) and peak bias as is shown in FIG. 3) that shows the relation between size error (for example, BIAS or peak BIAS) of the pattern formed on wafer W and the spectral characteristic (for example, FWHM or spectral purity width E95) of laser beam LB emitted from laser unit 16 and information related to the pattern that is used (for example, peak bias (Peak BIAS) information related to the reticle (mask) as is shown in FIG. 4). The information related to the reticle that is used can be input by the operator via input/output unit 62 as is described earlier. Or, for example, the peak bias (Peak BIAS) information and the like related to the reticle can be attached to reticle R as barcode (or a two-dimensional code) information, and main controller 50 can obtain the information by reading the barcode information with a barcode reader or the like when reticle R is loaded.

Further, according to exposure apparatus 10 of the embodiment, for example, main controller 50 obtains the total energy amount (which corresponds to the dose quantity on the wafer surface) of laser beam LB emitted from laser unit 16 based on the measurement values of integrator sensor 46, and decides the spectral width correction value based on the information of the total energy amount that has been obtained. In this case, the spectral width correction value of laser beam LB is decided so that size error of the image of the pattern of the reticle formed on wafer W does not occur on exposure. Then, main controller 50 adjusts the spectral width of the laser beam output from laser unit 16 to the spectral width that has been computed.

By the control or adjustment of the spectral width described above, the spectral width of laser beam is controlled so that an optimal resolution performance can be obtained. Accordingly, by performing exposure of wafer W with the laser beam on which control or adjustment of the spectral width has been performed, the pattern formed on wafer W is transferred onto wafer W, then on wafer W, the transferred image of the pattern (such as a resist image) can be formed without any size error.

Further, in the embodiment above, for example, main controller 50 can constantly monitor the output of the beam monitor inside beam monitor mechanism 16c, and by optimizing the exposure amount control of wafer W according to the change of the spectral width of laser beam LB, exposure can be performed constantly with an optimal resolution performance, without being affected by the spectral width change of laser beam LB.

In the case a linewidth error occurs in the pattern formed on wafer W by a change in the central wavelength of laser beam LB, the central wavelength of laser beam LB can be constantly monitored using beam monitor mechanism 16c, and at least one of the spectral width and the total exposure amount can be adjusted (controlled) based on the monitoring results.

In the first embodiment described above, the control (adjustment) of at least one of the spectral width and the total exposure amount based on the information above that has been obtained (information of at least one of the spectral width and the total exposure amount) can be performed while exposure of a shot area on wafer W is being performed. The control (adjustment) can also be performed after exposure of a shot area on wafer W has been completed before exposure of the next shot area begins, or it can be performed after exposure of a wafer has been completed before starting exposure of the next wafer.

Further, the control (adjustment) of the spectral width or the control (adjustment) of the exposure amount can be performed, according to the control amount (adjustment amount) of the linewidth error, which is obtained from the information above that has been obtained (information of at least one of the spectral width and the total exposure amount). For example, in the case the control amount of the linewidth error is larger than a predetermined threshold value, the spectral width can be adjusted (controlled), and in the case the control amount of the linewidth error is smaller than a predetermined threshold value, the total exposure amount can be adjusted (controlled).

Further, in the case of performing both the control (adjustment) of the spectral width and the control (adjustment) of the exposure amount based on the information above that has been obtained (information of at least one of the spectral width and the total exposure amount), each control can be performed at a different timing. For example, the control (adjustment) of the exposure amount can be performed while exposure of a shot area is performed, and the control (adjustment) of the spectral width can be performed when the laser beam is not irradiate on wafer W, such as during the stepping movement performed in between exposure of two shot areas, at the time of wafer exchange and the like.

Accordingly, main controller 50 does not have to constantly retrieve the output of the beam monitor inside beam monitor mechanism 16c, and the output can be taken in at a predetermined interval, or to be more specific, the output can be taken in each time wafer exchange is performed, or each time exposure of one lot of wafers has been completed.

Further, in the exposure apparatus of the embodiment above, the relation between the spectral width and the linewidth error, the relation between the total exposure amount and the linewidth error, the relation between the variation amount of the spectral line width and the variation amount of the Dose (for example, $\Delta$ Dose/$\Delta$ spectral width) and the like can be set in advance according to the exposure condition, such as for example, by the type of resist or the pattern formed on the wafer, or according to the illumination condition.

In the embodiment above, in the case of adjusting (changing) the exposure amount, the exposure amount can be uniformly increased/decreased within the exposure field (exposure area 42W previously described) regardless of the place within the field, or the exposure amount can be increased/decreased within only a part of the field so that the exposure amount is different from the other sections.

A part of the functions of main controller 50 related to the spectral control in the embodiment above can be performed by laser controller 16e within laser unit 16. Further, it is also a matter of course that at least a part of the functions of at least one of laser controller 16e and main controller 50 can be performed by a plurality of hardware, such as for example, a combination of a storage unit, an arithmetic unit, a control unit and the like.

In the first embodiment described above, both the adjustment (control) of the spectral width based on the information related to the reticle that is used (for example, the peak bias information) and the control of at least one of the spectral width and the total exposure amount based on the information above that has been obtained (such as information of the spectral width and the total exposure amount) are performed. However, the adjustment/control that is to be executed can be limited to just one operation. Further, in the embodiment above, the expression "so that linewidth error does not occur" is used. However, this is not limited to the case when the error is zero, and will also include the case when the error falls within an allowable range.

A Second Embodiment

Next, a second embodiment of the present invention will be described below, referring to FIG. 8. The system in the second embodiment is equipped with a plurality of laser units, which serve as a light source for each of a plurality of exposure apparatus. However, in the description below, from the viewpoint of avoiding complication, details on only two laser units 16A and 16B will be described. Further, the same reference numerals will be used for the sections that are the same or similar to the first embodiment described above, and the description thereabout will be omitted.

Figure 8:
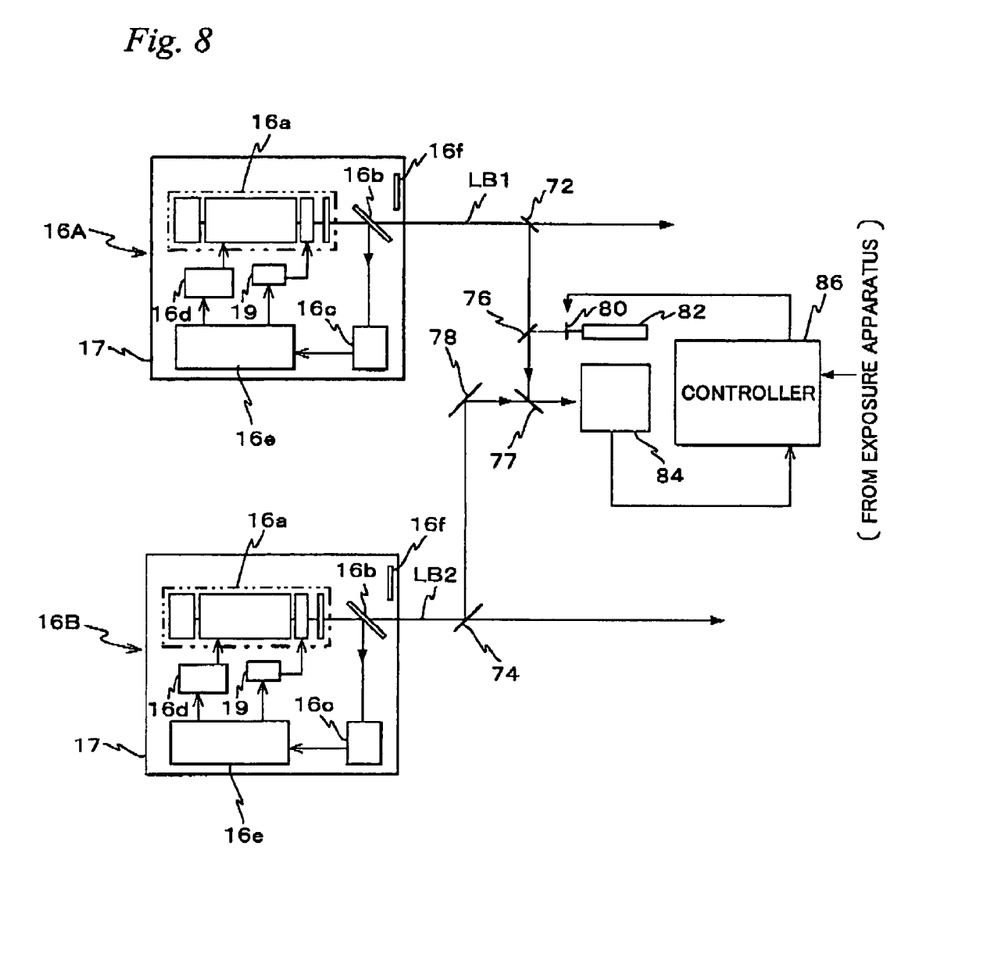
FIG. 8 is a view that shows an example of a configuration of a system related to a second embodiment.

Laser units 16A and 16B shown in FIG. 8 are each configured similar to laser unit 16 described earlier, except for the point that reference light source 16h, half mirror 16g, shutters 21 and 23 are not arranged. On the optical path of a laser beam LB1 emitted from laser resonator 16a of laser unit 16A, a beam splitter 72 is arranged that has a transmittance of around 97%. On the optical path of the laser beam LB1 reflected by beam splitter 72, half mirrors 76 and 77 are sequentially placed.

Downstream on the optical path of laser beam LB1 that has passed through beam splitter 72, an illumination optical system of an exposure apparatus (hereinafter referred to as a first exposure apparatus) which is configured similar to exposure apparatus 10 described earlier is placed via a light transmitting optical system (not shown). That is, laser unit 16A is an exposure light source of the first exposure apparatus.

On the optical path of a laser beam LB2 emitted from laser resonator 16a of laser unit 16B, a beam splitter 74 is arranged that has a transmittance of around 97%. On the optical path of the laser beam LB2 reflected by beam splitter 74, a mirror 78 is placed that bends the optical path at an angle of 90 degrees, and on the optical path of laser beam LB2 that has been bent by the mirror, half mirror 77 referred to earlier is placed.

Downstream on the optical path of laser beam LB2 that has passed through beam splitter 74, an illumination optical system of an exposure apparatus (hereinafter referred to as a second exposure apparatus) which is configured similar to exposure apparatus 10 described earlier is placed via a light transmitting optical system (not shown). That is, laser unit 16B is an exposure light source of the second exposure apparatus.

Half mirror 76 is positioned on the optical path of the laser beam LB1 reflected by beam splitter 72 and also on the optical path of a reference light source 82. As reference light source 82, an Ar ion second harmonic laser light source (Argon ion second harmonic laser light source) is used as in reference light source 16h.

On the optical path of the light emitted from reference light source 82 to half mirror 76, a shutter 80 is placed. Shutter 80 is closed at normal times. A controller 86 opens shutter 80 when necessary in the case controller 86 decides that shutter 16f of both of the exposure apparatus is closed, based on information from the first exposure apparatus and the second exposure apparatus. In a state where the shutter is opened, light from reference light source 82 is incident on a spectroscope 84 via half mirrors 76 and 77. The output signals of spectroscope 84 are loaded in controller 86 as an apparatus function, and then controller 86 updates the apparatus function at a predetermined interval.

Further, controller 86 communicates with the main controller of each exposure apparatus, and in a state where shutter 80 is closed, controller 86 selectively takes in laser beams LB1 and LB2 from laser units 16A and 16B into spectroscope 84, performs the deconvolution process that was described earlier to the output signals of spectroscope 84, and obtains the actual spectral signals of laser beams LB1 and LB2. Then, based on the actual spectral signals of laser beams LB1 and LB2 that have been obtained, controller 86 obtains information of the accurate spectral width (e.g. FWHM, or spectral purity width E95). The measurement of the spectral of laser beams LB1 and LB2 is also performed periodically, or when it is necessary.

Further, when controller 86 takes in laser beam LB1 from laser unit 16A (or laser beam LB2 from laser unit 16B) into spectroscope 84, controller 86 gives instructions to the main controller of the first exposure apparatus (or the second exposure apparatus) to take in laser beam LB1 (or laser beam LB2) into beam monitor mechanism 16c inside laser unit 16A (or laser unit 16B). Then, controller 86 can obtain the output of the beam monitor inside beam monitor mechanism 16c, that is, the measurement values of the spectral width by the beam monitor, from the main controller of the first exposure apparatus (or the second exposure apparatus), compare the measurement values with the spectral width of laser beam LB1 (or laser beam LB2) computed based on the output signals of spectroscope 84, and then send a coefficient for calibrating the measurement values of the beam monitor inside beam monitor mechanism 16c to the main controller of the first exposure apparatus (or the second exposure apparatus).

Incidentally, FIG. 8 indicates that laser beam LB1 (or laser beam LB2) is constantly incident on spectroscope 84 when laser beam LB1 (or laser beam LB2) is oscillated from laser resonator 16a in a state where shutter 16f of the laser units 16A and 16B are open. However, shutters are actually arranged that open/close the optical path of the laser beam LB1 reflected by beam splitter 72 and the optical path of the laser beam LB2 reflected by beam splitter 74, respectively. Controller 86 closes these shutters when laser beams LB1 and LB2 do not have to be incident on spectroscope 84.

According to the system in the second embodiment described above, calibration of spectroscope 84 is performed using reference light source 82, and by using spectroscope 84 that has been calibrated so as to perform spectral width measurement of laser beams LB1 and LB2 output from the plurality of laser units 16A and 16B, the spectral width of the laser beams emitted from each laser unit can be measured with good precision. Further, by performing simultaneous measurement of the spectral width of the laser beam (LB1 or LB2) using the beam monitor (spectral monitor) inside beam monitor mechanism 16c of each of the laser units 16A and 16b and spectroscope 84 that has been calibrated, the beam monitors (spectral monitors) can be calibrated easily and with good precision.

Further, in the second embodiment, laser units 16A and 16B are each a light source of a different exposure apparatus. Therefore, in the case of performing a mix-and-match exposure using these exposure apparatus, improvement in CD matching between the exposure apparatus as well as in flexibility when a reticle is shared can be expected.

In the second embodiment described above, calibration of laser units 16A and 16B can be performed when the laser units are not used in exposure, such as at the time of self oscillation (Self lock oscillation) for maintaining the so-called laser quality. In this case, sync out signals or the like from each laser unit can be switched using a common interface of the apparatus group, and spectral measurement can be performed. However, in such a case, a part of the configuration of the system will have to be changed so that the laser beam at the time of self oscillation can be incident on the spectroscope in a state where shutter 16f is closed.

In the embodiment above, the case has been described where the present invention is applied to a scanning exposure apparatus of the step-and-scan method, however, besides such an apparatus, the present invention can also be suitably applied to an exposure apparatus by the step-and-repeat method (the so-called stepper) or to an exposure apparatus by the step-and-stitch method. In the case of applying this invention to a stepper and the like, the exposure amount with respect to the wafer can be controlled by employing a method of adjusting the number of laser pulses irradiated on a certain point on a wafer while the energy value of each pulse output from the laser unit is constant, a method of changing the energy value of each pulse while making the irradiation pulse number a constant value, or a control method that combines both methods.

Besides the exposure apparatus described above, the present invention can also be applied to a liquid immersion exposure apparatus that has liquid filled in a space between projection optical system PL and the wafer whose details are disclosed in, for example, the pamphlet of International Publication WO2004/053955 and the corresponding U.S. Patent Application Publication 2005/0259234. Besides such apparatus, the present invention can also be applied to a liquid immersion exposure apparatus in which exposure is performed in a state where the entire surface of the wafer subject to exposure is soaked in liquid whose details are disclosed in, for example, Kokai (Japanese Unexamined Patent Publication) No. 6-124873, Kokai (Japanese Unexamined Patent Publication) No. 10-303114, and U.S. Pat. No. 5,825,043. Further, the present invention can also be applied to an exposure apparatus (a lithography system) that forms a line-and-space pattern on a substrate by forming interference fringes on a substrate whose details are disclosed in, for example, the pamphlet of International Publication WO2001/035168. Furthermore, the present invention can also be applied to an exposure apparatus that synthesizes patterns of two reticles on a wafer via a projection optical system, and performs double exposure of a shot area on the wafer almost simultaneously in one scanning exposure, as is disclosed in, for example, Kohyo (Japanese Unexamined Patent Publication) No. 2004-519850 (the corresponding U.S. Pat. No. 6,611,316). As long as the national laws in designated states (or elected states), on which this international application is applied, permit, the above disclosures of the pamphlet of the International Publications, each of the publications, the U.S. Patent Application Publications, and the U.S. Patent descriptions are each incorporated herein by reference.

In the above embodiment, a transmittance type mask, which is a transmissive substrate on which a predetermined light shielding pattern (or a phase pattern or a light attenuation pattern) is formed, was used. Instead of this mask, however, as is disclosed in, for example, U.S. Pat. No. 6,778,257, an electron mask (also called a variable shaped mask, including for example, a DMD (Digital Micromirror Device), which is a kind of a non-radiative image display device (a spatial optical modulator), or the like) on which a light-transmitting pattern, a reflection pattern, or an emission pattern is formed according to electronic data of the pattern that is to be exposed can also be used. As long as the national laws in designated states (or elected states), on which this international application is applied, permit, the above disclosure of the U.S. Patent description is incorporated herein by reference.

In the embodiment above, for example, a harmonic wave may also be used as the laser beam, which is obtained by amplifying a single-wavelength laser beam in the infrared or visible range emitted by a DFB semiconductor laser or fiber laser, with a fiber amplifier doped with, for example, erbium (or both erbium and ytteribium), and by converting the wavelength into ultraviolet light using a nonlinear optical crystal, as is disclosed in, for example, the pamphlet of International Publication WO1999/46835 (the corresponding U.S. Pat. No. 7,023,610).

Further, as the laser light source, a light source that generates vacuum ultraviolet light such as a $Kr_2$ laser (Krypton dimer laser) having the wavelength of 146 nm or an $Ar_2$ laser (Argon dimer laser) having the wavelength of 126 nm can also be used.

Further, the projection optical system is not limited to a reduction system, and the system may be either an equal magnifying system or a magnifying system. The projection optical system is not limited to a refracting system, and the system can be either a reflection system or a catadioptric system, and the projected image can be either an inverted image or an upright image.

Further, the application of the present invention is not limited to the exposure apparatus for manufacturing semiconductors, and the present invention can also be widely applied to an exposure apparatus used for manufacturing liquid crystal displays in which a liquid crystal display pattern is transferred onto a square glass plate, or to an exposure apparatus used for manufacturing thin film magnetic heads, micromachines, DNA chips and the like. Further, the present invention can also be applied to not only an exposure apparatus manufacturing microdevices such as a semiconductor element, but also can be applied to an exposure apparatus for transferring a circuit pattern onto a glass substrate, silicon wafer, or the like to manufacture a reticle or mask. The reticle and mask are used in an apparatus such as an optical exposure apparatus, an EUV exposure apparatus, and X-ray exposure apparatus, and electron beam exposure apparatus, and the like.

Semiconductor devices are manufactured through the following steps: a step where the function/performance design of a device is performed; a step where a reticle based on the design step is manufactured; a step where a wafer is manufactured using materials such as silicon; a lithography step where the pattern formed on the reticle is transferred onto an object such as the wafer using the exposure methods described in the embodiments above; a device assembly step (including processes such as a dicing process, a bonding process, and a packaging process); an inspection step, and the like. In this case, in the lithography step, because the exposure apparatus and the exposure method in the embodiments above are used, high integration devices can be manufactured with good yield.

INDUSTRIAL APPLICABILITY

As is described above, the exposure apparatus, exposure method, and device manufacturing method of the present invention is suitable for manufacturing electronic devices such as semiconductor elements and the like. Further, the system of the present invention is suitable for calibrating the optical properties of a plurality of laser units.

What is claimed is:

1. An exposure apparatus that exposes an object with an energy beam and forms a pattern on the object, the apparatus comprising:
    a laser unit that emits a laser beam as the energy beam;
    a storage unit that stores a pattern size error-spectral characteristic information which shows a relation between size error of the pattern formed on the object and spectral characteristic of the laser beam emitted from the laser unit; and
    a spectral control unit that controls spectral width of the laser beam based on the pattern size error-spectral characteristic information and information related to the pattern that is to be used,
    the pattern size error-spectral characteristic information is peak bias-spectral width information; and
    the information related to the pattern that is to be used is peak bias information related to a mask that is to be used.

2. The exposure apparatus of claim 1 wherein
    the spectral control unit computes spectral width of the laser beam so as to suppress the size error based on the pattern size error-spectral characteristic information and the information related to the pattern that is to be used, and controls the spectral width based on the computed results.

3. The exposure apparatus of claim 2, the apparatus further comprising:
    a mask table where the mask on which the pattern that is to be used is formed, whereby
    as the information related to the pattern is used, information related to the mask is used.

4. The exposure apparatus of claim 3 wherein
    the pattern size error-spectral characteristic information includes a spectral bias function unique to an exposure apparatus, and the information related to the mask includes a mask bias function, whereby
    the spectral control unit computes the spectral width of the laser beam so as to suppress the size error, based on a correlation coefficient between the spectral bias function and the mask bias function.

5. The exposure apparatus of claim 1 wherein
    at least a part of the spectral control unit is arranged in the laser unit.

6. The exposure apparatus of claim 1, the apparatus further comprising:
    an exposure amount control unit that controls a total exposure amount with respect to the object according to the spectral width.

7. The exposure apparatus of claim 6 wherein
    in the storage unit, a spectral width-total exposure amount information that shows a relation between the spectral width of the laser beam and the total exposure amount is further stored, whereby
    the exposure amount control unit obtains spectral width information of the laser beam emitted from the laser unit and controls the total exposure amount with respect to the object, based on the spectral width information that has been obtained and the spectral width-total exposure amount information.

8. The exposure apparatus of claim 7 wherein
    the spectral width-total exposure amount information includes a relation between the spectral width of the laser beam and the size error of the pattern, and a relation between the total exposure amount and the size error of the pattern.

9. The exposure apparatus of claim 1 wherein
    the spectral control unit controls the spectral width of the laser beam according to a total exposure amount with respect to the object.

10. The exposure apparatus of claim 9 wherein
    in the storage unit, a spectral width-total exposure amount information that shows a relation between the spectral width of the laser beam and the total exposure amount is further stored, whereby
    the spectral control unit obtains information of the total exposure amount of the laser beam emitted from the laser unit and controls the spectral width of the laser beam, based on the information of the total exposure amount that has been obtained and the spectral width-total exposure amount information.

11. The exposure apparatus of claim 10 wherein
    the spectral width-total exposure amount information includes a relation between the spectral width of the laser beam and the size error of the pattern, and a relation between the total exposure amount and the size error of the pattern.

12. The exposure apparatus of claim 1 wherein the spectral width being controlled by adjusting parameters of at least one of a laser gas inside excimer laser tube, a narrowbanding module and a discharging electrode circuit in laser power supply unit.

13. An exposure method in which an object is exposed with a laser beam emitted from a laser light source and a pattern is formed on the object, the method comprising:

a process of inputting information related to a pattern that is to be used; and a process of controlling spectral width of the laser beam, based on the information that has been input and a pattern size error-spectral characteristic information which shows a relation between size error of the pattern formed on the object and spectral characteristic of the laser beam emitted from the laser light source, in the process of inputting, peak bias information related to a mask that is to be used is input, as the information related to the pattern that is to be used; and in the process of controlling, the spectral width of the laser beam is controlled based on the information that has been input and peak bias-spectral width information serving as the pattern size error-spectral characteristic information.

14. The exposure method of claim 13 wherein in the process of controlling the spectral width of the laser beam, spectral width of the laser beam is computed so as to suppress the size error based on the pattern size error-spectral characteristic information and the information related to the pattern that is to be used, and the spectral width is controlled based on the computed results.

15. The exposure method of claim 14 wherein the pattern that is to be used is formed on the mask, and as the information related to the pattern is used, information related to the mask is used.

16. The exposure method of claim 15 wherein the pattern size error-spectral characteristic information includes a spectral bias function unique to an exposure apparatus, and the information related to the mask includes a mask bias function, whereby in the process of controlling the spectral width of the laser beam, the spectral width of the laser beam is computed so as to suppress the size error, based on a correlation coefficient between the spectral bias function and the mask bias function.

17. The exposure method of claim 13, the method further comprising:

a process of controlling a total exposure amount with respect to the object according to the spectral width.

18. The exposure method of claim 17, the method further comprising:

a process of obtaining a spectral width-total exposure amount information that shows a relation between the spectral width of the laser beam and the total exposure amount, whereby in the process of controlling the total exposure amount, spectral width information of the laser beam emitted from the laser light source is obtained and the total exposure amount with respect to the object is controlled, based on the information of the spectral width that has been obtained and the spectral width-total exposure amount information.

19. The exposure method of claim 18 wherein the spectral width-total exposure amount information includes a relation between the spectral width of the laser beam and the size error of the pattern, and a relation between the total exposure amount and the size error of the pattern.

20. The exposure method of claim 13, the method further comprising:

a process of obtaining the spectral width-total exposure amount information that shows a relation between spectral width of the laser beam and the total exposure amount, wherein in the process of controlling spectral width, information of the total exposure amount of the laser beam emitted from the laser light source is obtained, and the spectral width of the laser beam is controlled, based on the information of the total exposure amount that has been obtained and the spectral width-total exposure amount information.

21. The exposure method of claim 20 wherein the spectral width-total exposure amount information includes a relation between the spectral width of the laser beam and the size error of the pattern, and a relation between the total exposure amount and the size error of the pattern.

22. A device manufacturing method including a lithography process, wherein in the lithography process, a pattern is formed on a sensitive object by using the exposure method of claim 13.

23. The exposure method of claim 13, wherein controlling of the spectral width is performed by adjusting parameters of at least one of a laser gas inside excimer laser tube, a narrow-banding module and a discharging electrode circuit in laser power supply unit.

* * * * *

UNITED STATES PATENT AND TRADEMARK OFFICE
CERTIFICATE OF CORRECTION

PATENT NO. : 7,701,555 B2
APPLICATION NO. : 11/662591
DATED : April 20, 2010
INVENTOR(S) : Masayoshi Arai It is certified that error appears in the above-identified patent and that said Letters Patent is hereby corrected as shown below:

Title page, item (86), change:

"(86) PCT No.: PCT/JP2006/013104"

to

--(86) PCT No.: PCT/JP2006/313104--.

Signed and Sealed this

Twenty-second Day of June, 2010

David J. Kappos
*Director of the United States Patent and Trademark Office*